(12) United States Patent
Choi

(10) Patent No.: US 6,190,944 B1
(45) Date of Patent: Feb. 20, 2001

(54) STACKED PACKAGE FOR SEMICONDUCTOR DEVICE AND FABRICATION METHOD THEREOF, AND APPARATUS FOR MAKING THE STACKED PACKAGE

(75) Inventor: Chang Kuk Choi, Seoul (KR)

(73) Assignee: Hyundai Electronics Industries Co., Ltd., Kyoungki-do (KR)

( * ) Notice: Under 35 U.S.C. 154(b), the term of this patent shall be extended for 0 days.

(21) Appl. No.: 09/314,010

(22) Filed: May 19, 1999

(30) Foreign Application Priority Data

Jan. 20, 1999 (KR) .................................................. 99-1661

(51) Int. Cl.⁷ .................................................. H01L 21/44
(52) U.S. Cl. .......................... 438/109; 438/106; 438/107; 438/108; 438/110; 438/111; 438/112; 438/123; 257/678; 257/685; 257/686; 257/692; 257/693; 257/723; 257/730
(58) Field of Search .................................... 438/109, 106, 438/107, 108, 110, 111, 112, 123; 257/678, 685, 686, 692, 693, 723, 730

(56) References Cited

U.S. PATENT DOCUMENTS

| | | | |
|---|---|---|---|
| 5,332,922 | * | 7/1994 | Oguchi et al. .................. 257/723 |
| 5,446,620 | | 8/1995 | Burns et al. . |
| 5,804,874 | * | 2/2000 | An et al. .................. 257/676 |
| 6,030,858 | * | 2/2000 | Cha et al. .................. 438/123 |
| 6,118,176 | * | 2/2000 | Tao et al. .................. 257/676 |

* cited by examiner

Primary Examiner—Matthew Smith
Assistant Examiner—Belur Keshavan

(57) ABSTRACT

A stacked semiconductor package with ultrahigh integration and a fabrication method thereof according to the present invention are provided to meet the requirements of a system device of being miniaturized and light-weighted and having high efficiency. Also, there is provide a jig for package aligning to fabricate the stacked semiconductor package. The semiconductor package according to the present invention is fabricated by mounting a second-type package including a molding portion and leads exposed at a lower surface of the molding portion of the second-type package on a first-type package including a molding portion and leads, each of being formed in a 'J' shape, which are respectively extended out of both sides of the molding portion. Here, uppermost surfaces of the leads of the first-type package are welded by solder to bottom surfaces of the leads of the second-type package. The stacked semiconductor package according to the present invention has advantages in which work process is relatively short compared to the conventional art and also package fabrication costs are reduced.

7 Claims, 8 Drawing Sheets

STACKED PACKAGE FOR SEMICONDUCTOR DEVICE AND FABRICATION METHOD THEREOF, AND APPARATUS FOR MAKING THE STACKED PACKAGE

BACKGROUND OF THE INVENTION

1. Field of the Invention

The present invention relates to a semiconductor package and a fabrication thereof, and more particularly to a stacked package for a semiconductor device and a fabrication method thereof, and an apparatus for making the stacked package that increase the packaging density of a semiconductor chip without enlarging a system occupying area in a system device.

2. Description of the Conventional Art

Since the system device has been required to be miniaturized and light-weighted and have high efficiency, numerous studies have been vigorously made for a three-dimensional package, that is a stacked semiconductor package, in order to have more integrated circuits than the previous packages with the same size thereof. For the known stacked semiconductor package, there has been used a semiconductor package wherein thin small outline packages (TSOP) are stacked, the TSOP having the same planar size as the conventional package but half the thickness thereof.

FIG. 1 illustrates a structure of the conventional package T.

As shown therein, individual packages P, for example, four individual packages, are stacked, each package P having U-shaped outer leads 1, and the outer leads 1 which are positioned along the same column are connected by one rail 2. Thus, signal input and output between the outer leads 1 and a printed circuit board (not shown) are achieved through the rails 2, the outer leads 1 being connected by being inserted into slots 4 formed at an inner edge of each rail 2.

FIG. 2 is a cross-sectional view taken along the line of II—II of FIG. 1 to show the connection between the rail 2 and the external leads 2 of the package.

As shown therein, the rail 2 is vertically formed and has the inner edge 3 facing a margin of a side of the individual package P. The inner edge 3 has the slots or recesses 4 which are formed in the same type of the external lead 1. Further, an extension portion 5 is formed extendedly from a top portion of the rail 2 perpendicularly to the direction the rail 2.

In other words, each external lead 1 of the individual semiconductor package P is inserted and thus fixed to the corresponding slot 4 of the rail 2, and a lower surface 5a of the extension portion 5 is adhered by an adhesive to an upper surface Pa of the package P which is uppermost stacked. Accordingly, the multi-layered semiconductor packages P are not individually separated, but assembled into the stacked package T by the rails 2 and the extension portions 5.

To fabricate such stacked semiconductor package T, first there is provided the individual semiconductor package P having the plurality of U-shaped outer leads 1 by the well-known fabrication method. More specifically, the method of fabricating the individual semiconductor package P includes die-attaching for attaching a semiconductor chip on a lead frame having inner and outer leads, wiring for connecting pads formed on the semiconductor chip to the inner leads thereof by wires, molding for covering the semiconductor chip, the wires and the inner leads by a molding compound and shaping for forming the shape of each outer lead to a U shape. Then, the individual semiconductor packages P are stacked and adhered by the adhesive.

Next, the external leads 1 of the individual semiconductor packages P are inserted into the corresponding slots 4 of the rails 2 and then the lower surfaces of the extension portions 5 extended from the top portions of the rails 2 are attached to the top surface of the uppermost stacked semiconductor package.

Further, solder dipping is processed by holding the individual semiconductor packages which are fixed as a single unit by the rails by a package binder and putting the rails and the outer leads into a solder paste box to dip the tips of the outer leads in the solder paste.

Finally, the rails and the outer leads are welded not to be separated from each other by reflowing for the solder covering the tips of the outer leads.

As described above, the rail takes charge of the signal input and output between external circuits of the printed circuit board and the semiconductor chip. However, as the number of the outer leads of the semiconductor package increases, the lead pitch decreases and accordingly rail-to-rail distance diminishes. Thus, in the solder dipping for fabricating the conventional stacked semiconductor package, the adjacent rails become short by the solder paste and the semiconductor device is not able to perform the normal signal input/output operation, which results in increase in the percent defective of the package.

Further, in the conventional package fabricating process, since the outer leads are manually inserted to the rails, the automation therefor can not be achieved. Thus, the package assembling process takes considerably long time and also the general package fabrication cost increase due to the increase in labor cost.

In addition, since the rails are required for fabricating the conventional package, except for the outer leads, compared to the previously developed stacked semiconductor packages, the fabrication cost of the package also unavoidably increase.

SUMMARY OF THE INVENTION

Accordingly, the present invention is directed to a stacked package for a semiconductor device and a fabrication method thereof, and apparatus for making the stacked package which obviate the problems and disadvantages due to the conventional art.

An object of the present invention is to provide a semiconductor package and a fabrication method thereof that fabricate a package having a narrow lead pitch due to a high-pin package system with relatively low fabrication costs, decrease percent defective of the package and increase the productivity thereof.

An object of the present invention is to provide a jig for package aligning used for fabricating a stacked package according to the present invention.

An object of the present invention is to provide a stacked semiconductor package by using a bottom leaded package (BLP).

To achieve these and other advantages and in accordance with the purpose of the present invention, as embodied and broadly described, there is provided a stacked semiconductor package including: a first-type package which consists of a semiconductor chip having a plurality of pads formed on a center portion of an upper surface thereof, leads of which end portions are attached on the upper surface of the semiconductor chip at outer sides of the pads and the other end portions are externally extended from the semiconductor chip, wires for connecting the ends portions of the leads to the corresponding pads, and a molding portion covering the semiconductor chip, the wires and portions of the leads; and a second-type package including a semiconductor chip having a plurality of pads formed on a center portion of a lower surface thereof, leads each of which consists of a chip-attached portion, a substrate-attached portion and a connecting portion and is formed in a 'S' shape, top surfaces of the chip-attached portions of the leads being respectively attached to portions of the lower surface of the semiconductor chip at the outer sides of the pads, wires for connecting end portions of the chip-attached portions to the corresponding pads, and a molding portion covering the semiconductor chip, the pads, the wires, and the chip-attached portions and the connecting portions of the leads; wherein the lower surfaces of the substrate-attached portions of the leads of the second-type package are welded by solder to upper surfaces of exposed portions of the leads of the first-type package which are externally extended out of the molding portion.

Further, in order to achieve the above objects of the present invention, there is provided a method for fabricating a stacked semiconductor package which includes the steps of: fabricating a first-type package including a semiconductor chip having a plurality of pads on a center portion of an upper surface thereof, leads of which end portions are attached on the upper surface of the semiconductor chip at outer sides of the pads and the other end portions are externally extended from the semiconductor chip, wires for connecting the ends portions of the leads to the corresponding pads, and a molding portion covering the semiconductor chip, the wires and portions of the leads; fabricating a second-type package including a semiconductor chip having a plurality of pads on a center portion of a lower surface thereof, leads each of which consists of a chip-attached portion, a substrate-attached portion and a connecting portion and is formed in a 'S' shape, top surfaces of the chip-attached portions of the leads being respectively attached to portions of the lower surface of the semiconductor chip at the outer sides of the pads, wires for connecting end portions of the chip-attached portions to the corresponding pads, and a molding portion covering the semiconductor chip, the pads, the wires, and the chip-attached portions and the connecting portions of the leads; and attaching the lower surfaces of the substrate-attached portions of the leads of the second-type package to upper surfaces of the portions of the leads of the first-type package which are not covered by the molding portion; wherein the step of welding the lower surfaces of the substrate-attached portions of the leads of the second-type package to the upper surfaces of the portions of the leads of the first-type package which are not covered by the molding portion includes applying a flux to the lower surfaces of the substrate-attached portions of the leads of the second-type package, attaching a plurality of solder balls to the flux, mounting the second-type package on the first-type package so as to align the corresponding leads thereof, and reflowing for the solder balls.

Also, in order to achieve the above objects of the present invention, a material of the first and second-type packages is preferably a solder resist.

Further, the method for fabricating the stacked semiconductor package according to the present invention further includes the step of applying an adhesion to an upper surface of the molding portion of the second-type package before mounting the second-type package on the first-type package.

Further, in order to achieve the above objects of the present invention, there is provided a jig for package aligning which includes a substrate consisting of an insulating body having a predetermined height, a plurality of cavities formed at an upper portion of the body, through holes respectively formed in the cavities and penetrating the body, and align poles disposed at marginal portions of both sides of the body, and an align mask having a mask body, a plurality of openings penetrating the mask body and align holes formed in each corner of marginal portions of the mask body, wherein the align mask is attached on an upper surface of the substrate.

Additionally, in order to achieve the above objects of the present invention, there is provided a method for fabricating a stacked semiconductor package which includes the steps of: preparing a jig for package aligning including a substrate consisting of an insulating body having a predetermined height, a plurality of cavities formed at an upper portion of the body, through holes respectively formed in the cavities and penetrating the body, and align poles disposed at marginal portions of both sides of the body, and an align mask having a mask body, a plurality of openings penetrating the mask body and align holes formed in each corner of marginal portions of the mask body, wherein the align mask is attached on an upper surface of the substrate; placing a first-type package in each cavity, the first-type package including a semiconductor chip having a plurality of pads on a center portion of an upper surface thereof, leads of which end portions are attached on the upper surface of the semiconductor chip at outer sides of the pads and the other end portions are externally extended from the semiconductor chip, wires for connecting the ends portions of the leads to the corresponding pads, and a molding portion covering the semiconductor chip, the wires and portions of the leads; preparing a second-type package consisting of a semiconductor chip having a plurality of pads on a center portion of a lower surface thereof, leads each of which consists of a chip-attached portion, a substrate-attached portion and a connecting portion and is formed in a 'S' shape, top surfaces of the chip-attached portions of the leads being respectively attached to portions of the lower surface of the semiconductor chip at the outer sides of the pads, wires for connecting end portions of the chip-attached portions to the corresponding pads, and a molding portion covering the semiconductor chip, the pads, the wires, and the chip-attached portions and the connecting portions of the leads; attaching a plurality of solder balls to the lower surfaces of the substrate-attached portions of the leads of the second-type package; mounting the second-type package on the first-type package disposed in each opening of the jig for the package aligning; and reflowing for the solder balls.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1:
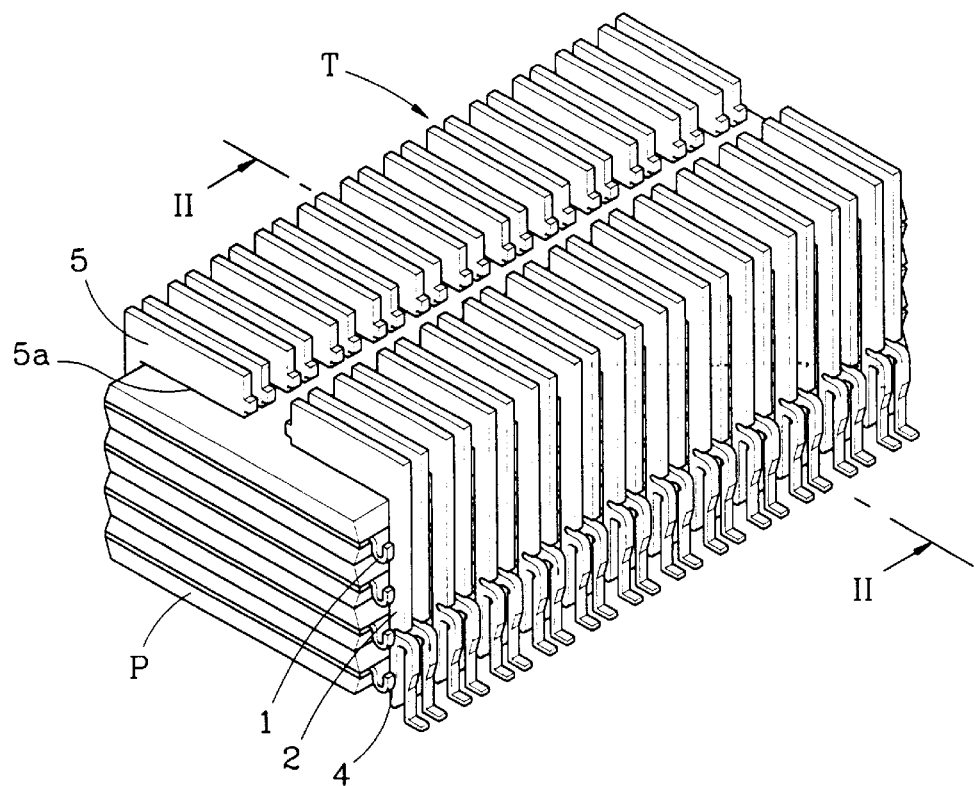
FIG. 1 is a perspective view of a conventional stacked semiconductor package.
Figure 2:
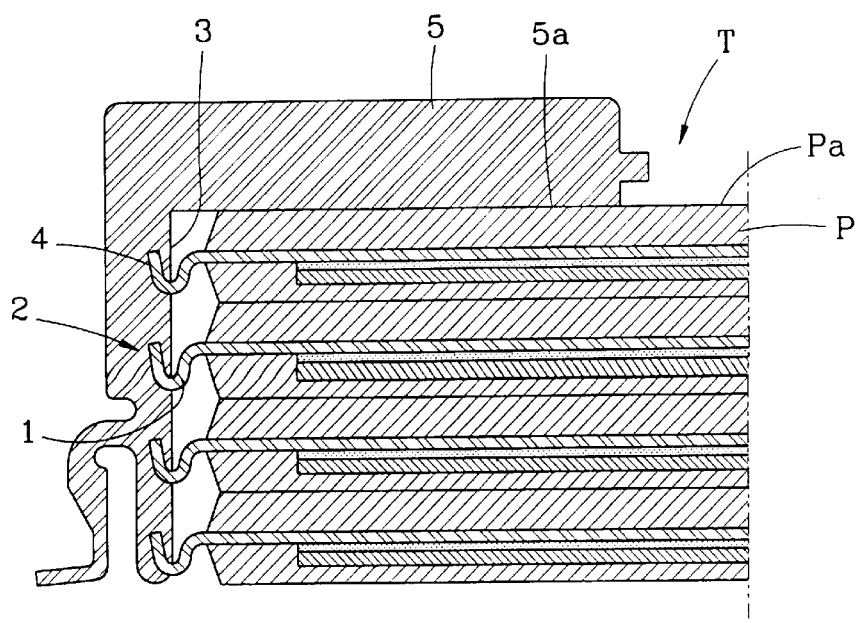
FIG. 2 is a vertical cross-sectional view taken along the line II—II in FIG. 1.
Figure 3A:
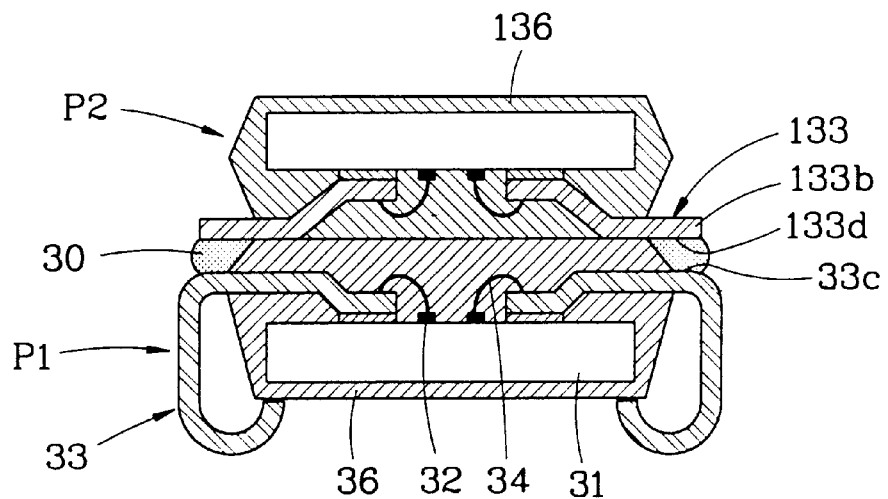
FIGS. 3A and 3B illustrate stacked semiconductor packages according to first and second embodiments, respectively, of the present invention.
Figure 3B:
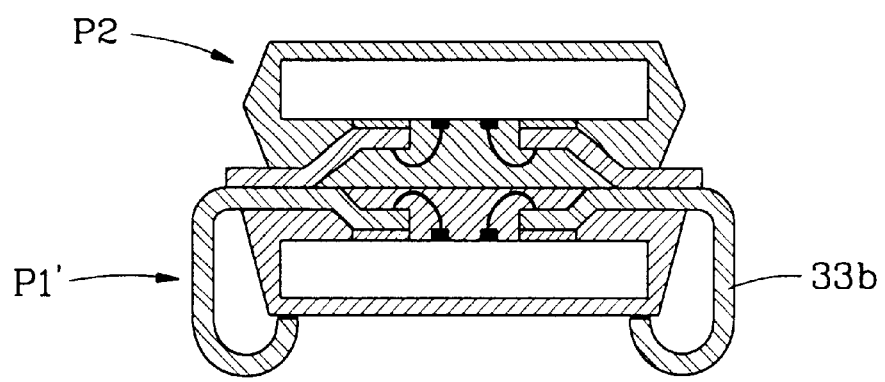

FIGS. 3A and 3B illustrate a stacked semiconductor package according to the present invention. As shown therein, the stacked semiconductor package according to the present invention is provided by stacking a second-type package P2 on a first-type package P1. Here, it is noted that uppermost surfaces 33c of outer leads 33b of the first-type package P1 are welded by solder 30 to bottom surfaces 133d of substrate-attached portions 133b of leads 133, the first and second-type packages P1, P2 being attached as a single unit. Further, in order to increase the adhesive strength of the first and second-type packages P1, P2, a top surface of a molding portion 36 of the first-type semiconductor package P1 is adhered by an adhesive to a bottom surface of a molding portion 136 of the second-type package P2.

Figure 4A:
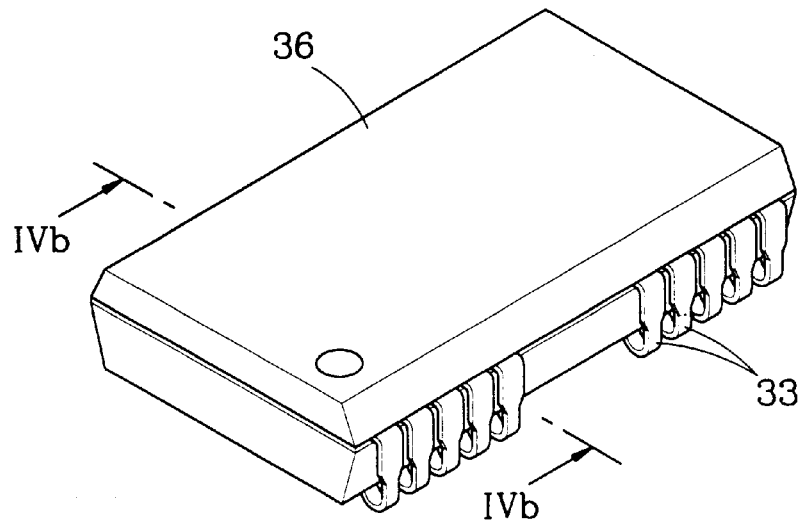
FIG. 4A is a perspective view of a first-type package for fabricating the stacked semiconductor package according to the present invention.

Specifically, FIG. 4A is a perspective view illustrating the first-type package P1 of the stacked semiconductor package. As shown therein, outer portions of the leads 33 are extended out of sides of the molding portion 36, each lead 33 being formed in a 'J' type.

Figure 4B:
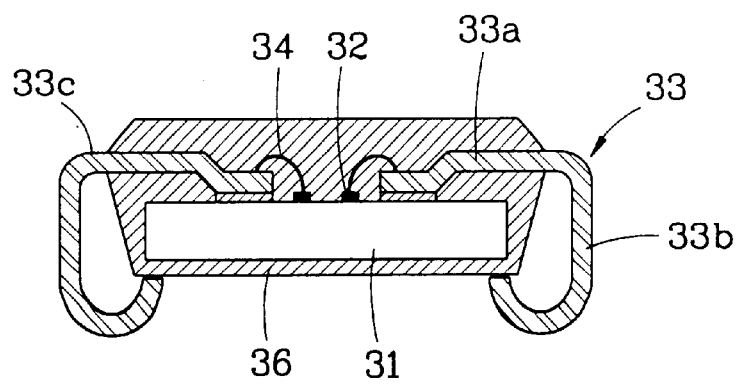
FIG. 4B is a vertical cross-sectional view taken along the line IVb—IVb in FIG. 4A.

FIG. 4B is a vertical cross-sectional view taken along the line IVb—IVb of FIG. 4A. As shown therein, in the first-type package P1, pads 32 are formed on a center portion of the top surface of the semiconductor chip 31 and the adhesive is applied onto the top surface thereof at outer sides of the pads to thereby attach the leads 33 thereto. In addition, end portions of the leads 33 are respectively connected to the corresponding pads 32 by wires 34. It is noted that the leads 33 are externally extended from the end portions of the semiconductor chip 31 and the parts thereof formed out of the semiconductor chip are respectively shaped in the 'J' type. Further, the molding portion 36 is covering the semiconductor chip 31, the wires 34 and specific portions of the leads 33. Hereinafter, a portion of each lead 33 inside of the molding portion 36 and a portion thereof extended out of the molding portion 36 are referred to as an internal lead 33a and the outer lead 33b, respectively, the outer lead 33b having the uppermost surface 33c.

Further, the first-type package which is to be positioned at a lower side of the fabricated stacked semiconductor package and then mounted on the printed circuit board has the 'J'-shape outer leads. Here, it is noted that the 'J'-shape outer lead is used for the present invention since the 'J'-shape outer lead is easier to be mounted on the printed circuit board compared to an outer lead having a 'L' or 'gull wing' shape applied to the conventional art.

To fabricate such first-type package P1, first, there is provided a semiconductor chip having a plurality of pads formed thereon and leads with the same number of the pads are placed on predetermined portions of a top surface of the semiconductor chip. Next, the pads and the corresponding leads are respectively connected by wires and then a molding process is applied to form a molding portion covering the semiconductor chip, the wires and the predetermined portion of each lead.

Figure 5A:
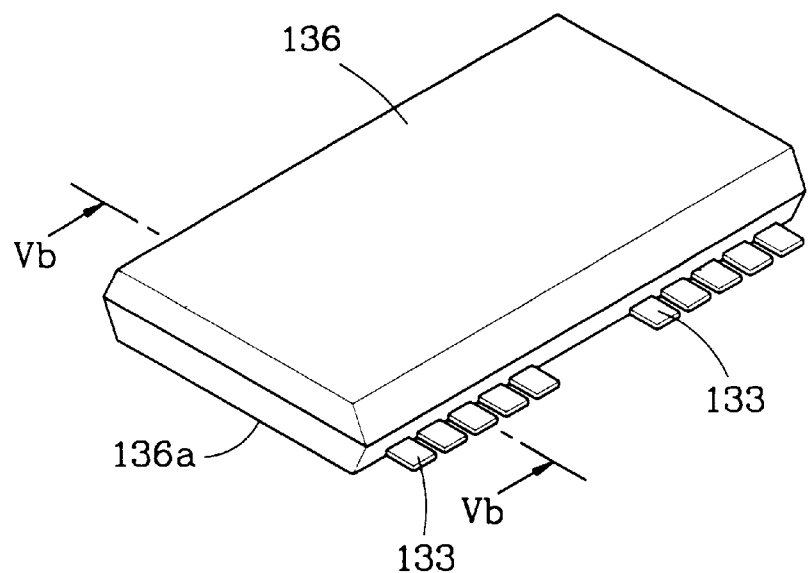
FIG. 5A is a perspective view of a second-type package for fabricating the stacked semiconductor package according to the present invention.
Figure 5B:
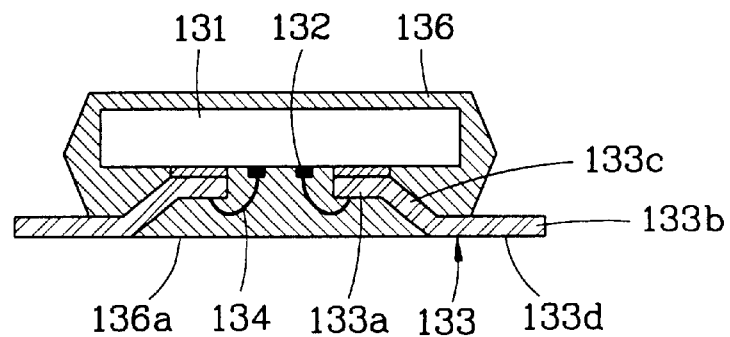
FIG. 5B is a vertical cross-sectional view taken along the line Vb—Vb in FIG. 5A.

Next, with reference to FIGS. 5A and 5B, the second-type package will be described in detail, wherein FIG. 5A is a perspective view of the second-type package and FIG. 5B is a vertical cross-sectional view taken along the line Vb—Vb in FIG. 5A.

More specifically, a plurality of pads 132 are attached to a center portion of a bottom surface of a semiconductor chip 131, and top surfaces of chip-attached portions 133a of the leads 133 are attached to corresponding portions of the bottom surface of the semiconductor chip 131 at the outer sides of the pads 132, each lead 133 consisting of the chip-attached portion 133a, the substrate-attached portion 133b and a connecting portion 133c which connects the chip-attached portion 133a to the substrate-attached portion 133b. Here, each lead 133 has a shape similar to a 'S' type. The substrate-attache portions 133b of the leads 133 are extended and exposed out of outer margins of the semiconductor chip 131. Further, end portions of the leads 133 and the corresponding pads 132 are connected by wires 134, and the molding portion 136 is covering the semiconductor chip 131, the wires 134, the chip-attached portions 133a and the connecting portions 133c of the leads 133, and the top surfaces of the substrate-attached portions 133b. Here, it is noted that a bottom surface of the molding portion 136 and the bottom surfaces 133d of the substrate-attached portions 133b of the leads 133 have the same surface level.

In the second-type package P2, a portion of each lead 133 is externally exposed at the same surface level as a bottom surface 136a of the molding portion 136 and accordingly the exposed portions, that is the bottom surfaces 133d of the surface-attached portions 133b, serve as the outer leads, this being referred to a bottom leaded package (BLP). The fabrication method of the BLP is disclosed in detail in U.S. Pat. No. 5,363,279.

While, FIG. 3B illustrates the stacked semiconductor package according to another embodiment of the present invention. Here, since those which are the same as the elements in FIG. 3A have the same reference numbers, the reference number will be omitted. As shown therein, the only difference from FIG. 3A is that the uppermost surfaces 33c of outer leads 33b of the first-type package P1' are exposed at the same surface level as the top surface of the molding portion 36. The second embodiment of the present invention has better electrical contact reliability than the first embodiment thereof, since the contact area between the leads 33 of the first-type package P1' and the leads 133 of the second-type package P2 is relatively large.

The fabrication method of the stacked semiconductor package of the present invention will be described.

First, to fabricate the semiconductor package according to the present invention, it is necessary to prepare a jig for package aligning.

Figure 6A:
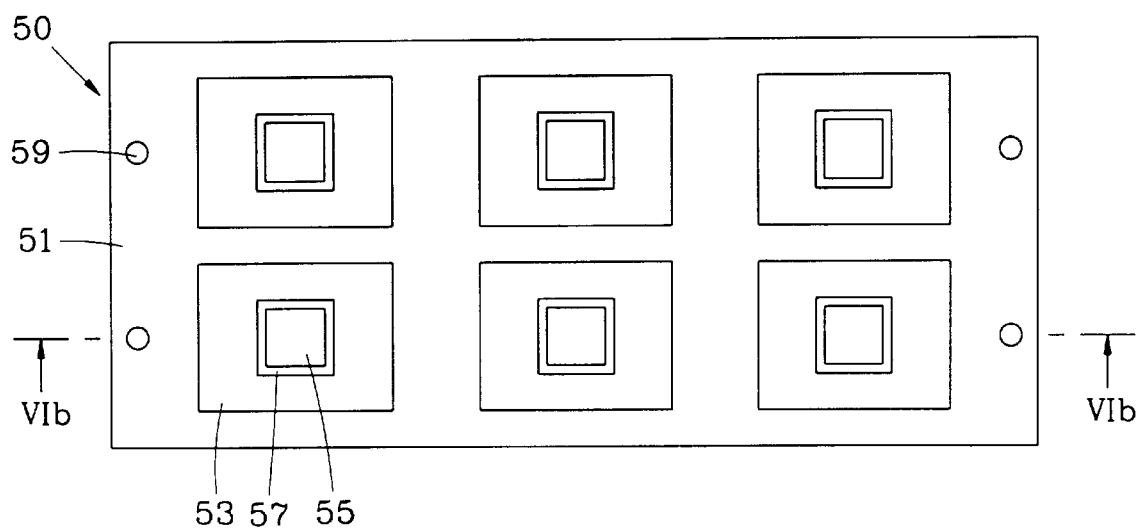
FIG. 6A is a plane view of a substrate constituting a jig for package aligning.
Figure 6B:
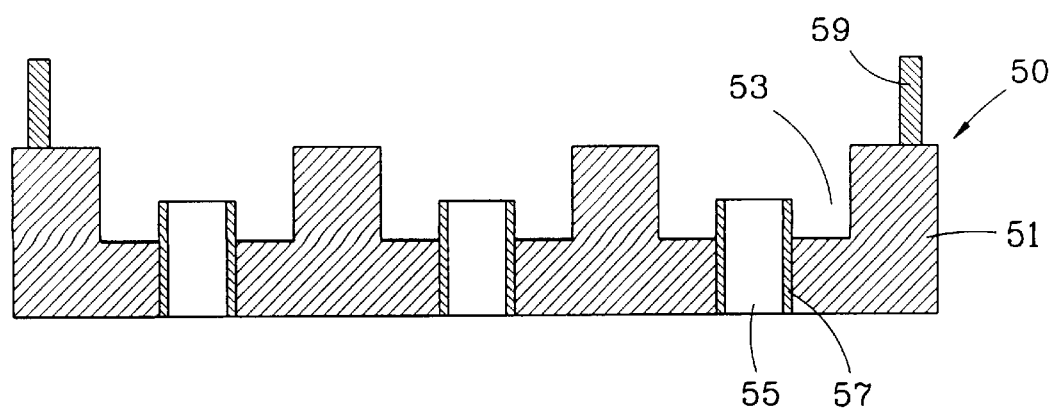
FIG. 6B is a vertical cross-sectional view taken along the line VIb—VIb in FIG. 6A.

FIG. 6A illustrates a substrate for the package aligning in a plane view and FIG. 6B is a vertical cross-sectional view taken along the line VIb—VIb in FIG. 6A. As shown therein, a substrate 50 has a body 51 of insulating material, the body 51 has a plurality of cavities 53. Here, the cavities 53 respectively have the same width, length and height as the external form of the first-type package P1, P1'. Further, there is formed a through hole 55 which penetrates the body 51 in each cavity 53, and a post 57 is formed in each cavity 53 along circumference of the through hole 55 at a predetermined height to thereby support the first-type package P1, P1' which is to be disposed in the cavity 53. In other words, in order to prevent the 'J'-shape outer leads of the package from being curved, the post 57 supports the bottom surface of the package so that the outer leads do not touch the bottom of the cavity 53, and the through holes 55 are connected to a vacuum pump (not shown). Accordingly, the package, for example the first package P1 disposed in the cavity 53 is fixed by vacuum suction via the through hole 55. In addition, align poles 59 are disposed at marginal portions of both sides of the body 51.

Figure 6C:
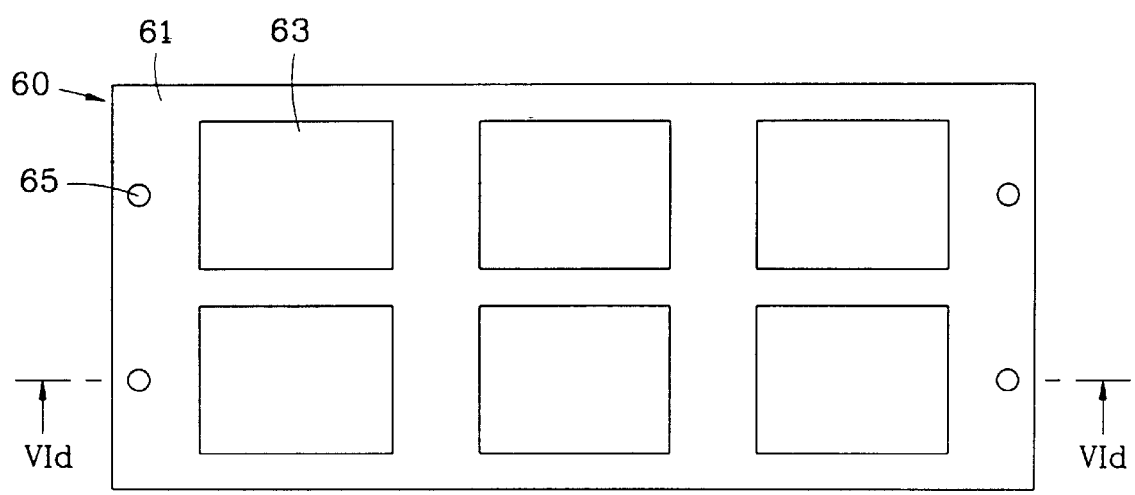
FIG. 6C is a plane view of an align mask also constituting the jig for the package aligning.
Figure 6D:
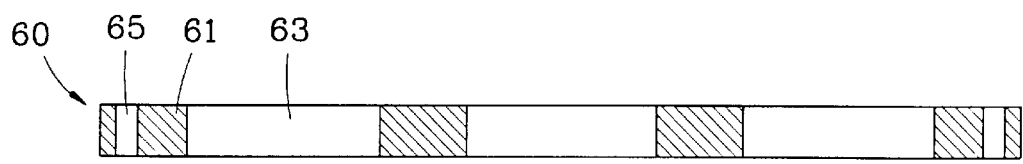
FIG. 6D is a vertical cross-sectional view taken along the line VId—VId in FIG. 6C.

Next, there is required to prepare an align mask. FIG. 6C illustrates the align mask 60 in a plane view and FIG. 6D is a vertical cross-sectional view taken along the line VId—VId in FIG. 6C. As shown therein, the align mask 60 consists of a mask body 61, a plurality of openings 63 which penetrate the mask body 61 and align holes 65 for aligning the align mask 60 when fixing the mask 60 to the substrate 50. Here, it is noted that each opening 63 has the same size as the external form of the package, for example the second-type package according to the present invention. In addition, the opening 63 is formed at a position which corresponds to the cavity 53 of the substrate 50 and also the size thereof is the same as the cavity 51. Each align hole 65 corresponds the position of the align pole 59.

Figure 6E:
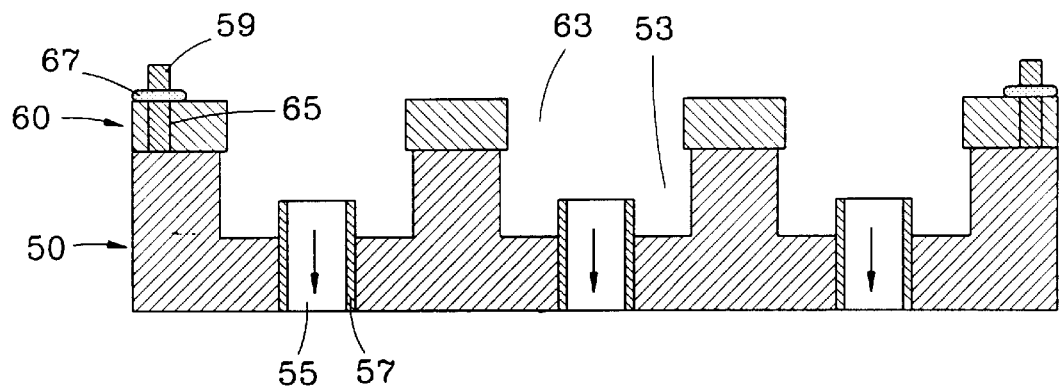
FIG. 6E is a vertical cross-sectional view of the jig for the package aligning.

FIG. 6E illustrates a jig 70 for the package aligning wherein the align mask 60 is placed on the substrate 50. As shown therein, the align poles 59 are inserted into the align holes 65 of the align mask 60 and locking devices 67 are respectively provided between the align poles 59 and the align holes 65 to securely fix the substrate 50 and the align mask 60. The jig 70 for the package aligning fixes the individual packages placed therein during the process for fabricating the stacked semiconductor package.

Figure 7A:
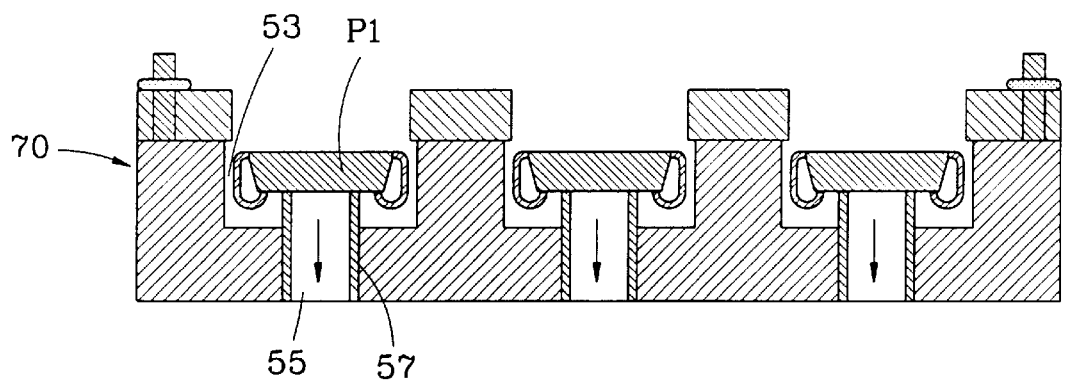
FIGS. 7A through 7E sequentially illustrate a method of fabricating a stacked semiconductor package according to the present invention.

The method for fabricating the stacked semiconductor package according to the present invention will now be described with reference to FIGS. 7A through 7E. As shown in FIG. 7A, for example, the first-type package P1 shown in FIG. 3 is placed on the post 57 in the cavity 53 of the jig 70 of FIG. 6E. Next, by operating a vacuum picker (not shown) connected to the through holes 55, the bottom surface of the first-type package P1 is securely fixed by the vacuum suction of the vacuum picker.

Figure 7B:
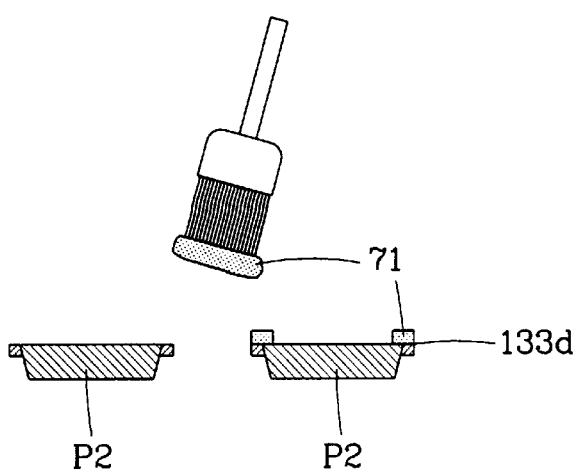

Next, as can be seen in FIG. 7B, a flux 71 is applied to the bottom surfaces 133*d* of the chip-attached portions 133*b* of the leads 133 of the second-type package P2.

Figure 7C:
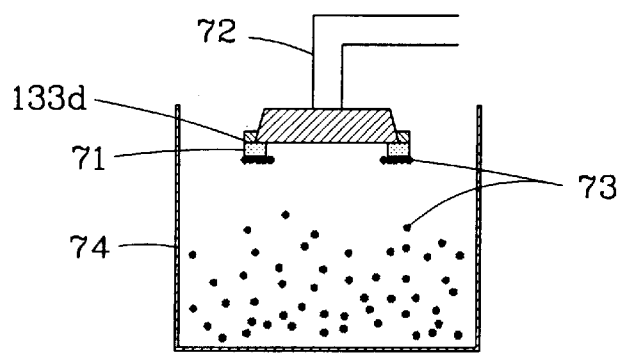

In FIG. 7C, the vacuum picker 72 holds the package P2 by the top surface thereof and puts it in a solder ball box 74 in which a plurality of solder balls 73 are provided, for thereby attaching the solder balls 73 to the bottom surfaces 133*d* of the chip-attached portions 133*b* of the leads 133 to which the flux 71 is applied.

Figure 7D:
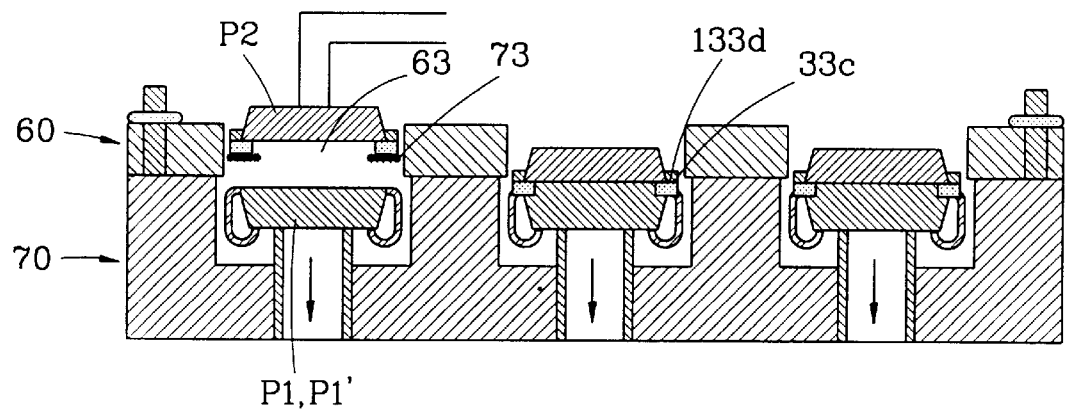

Further, as shown in FIG. 7D, the second-type package P2 of FIG. 7C is placed in the opening 63 and mounted on the corresponding first-type package P1. Next, reflowing for the solder balls 73 are processed so that the uppermost surfaces 33*c* of the outer leads 33*b* of the first-type package P1 are welded to the bottom surfaces 133*d* of the substrate-attached portions 133*b* of the leads 133 of the second-type package P2 by which the solder balls reflow.

Figure 7E:
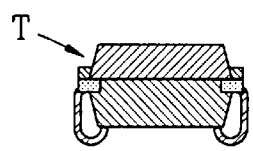

Finally, the jig 70 for the package aligning is removed and the fabrication of the stacked semiconductor package T is completed as can be seen in FIG. 7E.

In order to improve the adhesive strength of the first and second-type packages or first and second-type packages which are transformed into other shapes, there can be provided an additional process for applying an adhesive to the top surfaces of the molding portions 136 of, for example, the first-type package P1 after the process shown in FIG. 7A. Also, material which prevents the solder balls from attaching thereto, that is a resist, is preferably applied to the surfaces of the molding portions 36, 136 of the first and second-type packages, or material of the molding portions 36, 136 can be a solder resist, since when attaching the solder balls to the outer leads in the process of FIG. 7C, the solder balls may attach to the molding portions as well as the outer leads, the solder balls attached to the molding portions between the outer leads are fused during the reflowing process, which may result in short between the leads. However, if the material of the molding portion surfaces is the solder resist, the solder which has reflowed is gathered to the outer leads, because the solder is hardly attached to the molding portions while the solder balls attached to the surfaces of the molding portions reflow. Therefore, the short between the leads can be prevented.

Since the solder dipping applied to the conventional art is not necessary for the fabrication of the stacked semiconductor package of the present invention, the percent of which ultrahigh-integrated circuits may not perform the normal operation due to the sticking of the adjacent leads is considerably reduced which has an affect of increasing the productivity.

Further, no manual work is required in the fabrication of the stacked semiconductor package of the present invention due to the automation of the process, differently from the conventional art, which results in increase in package assembling speed and package assembling cost reduction.

Lastly, the material costs for assembling the stacked semiconductor package of the present invention are relatively low compared to the conventional art.

It will be apparent to those skilled in the art that various modifications and variations can be made in the stacked package for the semiconductor device and the fabrication method thereof, and the apparatus for fabricating the stacked package of the present invention without departing from the spirit or scope of the invention. Thus, it is intended that the present invention cover the modifications and variations of this invention provided they come within the scope of the appended claims and their equivalents.

What is claimed is:

1. A method for fabricating a stacked semiconductor package, comprising the steps of:

fabricating a first-type package including a semiconductor chip having a plurality of pads on a center portion of an upper surface thereof, leads of which end portions are attached on the upper surface of the semiconductor chip at outer sides of the pads and the other end portions are externally extended from the semiconductor chip, wires for connecting the ends portions of the leads to the corresponding pads, and a molding portion covering the semiconductor chip, the wires and portions of the leads;

fabricating a second-type package including a semiconductor chip having a plurality of pads on a center portion of a lower surface thereof, leads each of which consists of a chip-attached portion, a substrate-attached portion and a connecting portion and is formed in a 'S' shape, top surfaces of the chip-attached portions of the leads being respectively attached to portions of the lower surface of the semiconductor chip at the outer sides of the pads, wires for connecting end portions of the chip-attached portions to the corresponding pads, and a molding portion covering the semiconductor chip, the pads, the wires, and the chip-attached portions and the connecting portions of the leads; and welding the lower surfaces of the substrate-attached portions of the leads of the second-type package to upper surfaces of the portions of the leads of the first-type package which are not covered by the molding portion.

2. The method for fabricating the stacked semiconductor package according to claim 1, wherein the step of welding the lower surfaces of the substrate-attached portions of the leads of the second-type package to the upper surfaces of the portions of the leads of the first-type package which are not covered by the molding portion comprises:

applying a flux to the lower surfaces of the substrate-attached portions of the leads of the second-type package;

attaching a plurality of solder balls to the flux;

mounting the second-type package on the first-type package so as to align the corresponding leads thereof; and reflowing for the solder balls.

3. The method for fabricating the stacked semiconductor package according to claim 1, wherein a material of the first and second-type packages is a solder resist.

4. The method for fabricating the stacked semiconductor package according to claim 1, further comprising:

applying an adhesive member to an upper surface of the molding portion of the second-type package before mounting the second-type package on the first-type package.

5. The method for fabricating the stacked semiconductor package according to claim 1, wherein the step of fabricating the first-type package comprises:

preparing a semiconductor chip which has a plurality of pads on a center portion of an upper surface thereof;

attaching a plurality of leads at outer sides of the pads on the upper surface of the semiconductor chip;

connecting the pads to the leads, respectively, by wires; and forming a molding portions for covering the semiconductor chip, the pads, the wires and portions of the leads.

6. A method for fabricating a stacked semiconductor package, comprising the steps of:

preparing a jig for package aligning including a substrate consisting of an insulating body having a predetermined height, a plurality of cavities formed at an upper portion of the body, through holes respectively formed in the cavities and penetrating the body, and align poles disposed at marginal portions of both sides of the body, and an align mask having a mask body, a plurality of openings penetrating the mask body and align holes formed in each corner of marginal portions of the mask body, wherein the align mask is attached on an upper surface of the substrate;

placing a first-type package in each cavity, the first-type package including a semiconductor chip having a plurality of pads on a center portion of an upper surface thereof, leads of which end portions are attached on the upper surface of the semiconductor chip at outer sides of the pads and the other end portions are externally extended from the semiconductor chip, wires for connecting the ends portions of the leads to the corresponding pads, and a molding portion covering the semiconductor chip, the wires and portions of the leads;

preparing a second-type package consisting of a semiconductor chip having a plurality of pads on a center portion of a lower surface thereof, leads each of which consists of a chip-attached portion, a substrate-attached portion and a connecting portion and is formed in a 'S' shape, top surfaces of the chip-attached portions of the leads being respectively attached to portions of the lower surface of the semiconductor chip at the outer sides of the pads, wires for connecting end portions of the chip-attached portions to the corresponding pads, and a molding portion covering the semiconductor chip, the pads, the wires, and the chip-attached portions and the connecting portions of the leads;

attaching a plurality of solder balls to the lower surfaces of the substrate-attached portions of the leads of the second-type package;

mounting the second-type package on the first-type package disposed in each opening of the jig for the package aligning; and reflowing for the solder balls.

7. The method for fabricating the stacked semiconductor package according to claim 6, further comprising:

applying a flux to the lower surfaces of the substrate-attached portions of the leads of the second-type package before attaching the solder balls to the lower surfaces thereof.

* * * * *